US 8,180,919 B1

(12) United States Patent
Melinn et al.

(10) Patent No.: US 8,180,919 B1
(45) Date of Patent: May 15, 2012

(54) INTEGRATED CIRCUIT AND METHOD OF EMPLOYING A PROCESSOR IN AN INTEGRATED CIRCUIT

(75) Inventors: Francis G. Melinn, Shannon Co. (IE); Amit Dhir, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1664 days.

(21) Appl. No.: 10/902,905

(22) Filed: Jul. 30, 2004

(51) Int. Cl.
*G06F 15/16* (2006.01)

(52) U.S. Cl. ........ 709/236; 709/234; 709/235; 709/237; 370/470; 370/471; 370/472; 370/473; 370/474; 370/475; 370/476; 340/1.1; 716/100

(58) Field of Classification Search .................... 709/236
See application file for complete search history.

(56) References Cited

U.S. PATENT DOCUMENTS

| | | | | |
|---|---|---|---|---|
| 5,563,890 A * | 10/1996 | Freitas | ............. | 370/476 |
| 5,627,879 A * | 5/1997 | Russell et al. | ............. | 370/328 |
| 5,649,187 A * | 7/1997 | Hornbuckle | ............. | 1/1 |
| 5,786,755 A * | 7/1998 | Cicchino et al. | ............. | 340/506 |
| 5,857,092 A * | 1/1999 | Nakamura et al. | ............. | 710/62 |
| 5,930,263 A * | 7/1999 | Nielsen | ............. | 370/465 |
| 6,021,112 A * | 2/2000 | Sugawara | ............. | 370/222 |
| 6,026,088 A * | 2/2000 | Rostoker et al. | ............. | 370/395.53 |
| 6,160,365 A * | 12/2000 | Younger et al. | ............. | 318/16 |
| 6,163,526 A * | 12/2000 | Egoshi | ............. | 370/228 |
| 6,188,692 B1 * | 2/2001 | Huscroft et al. | ............. | 370/395.51 |
| 6,263,218 B1 * | 7/2001 | Kita | ............. | 455/567 |
| 6,333,940 B1 * | 12/2001 | Baydar et al. | ............. | 370/506 |
| 6,343,068 B1 * | 1/2002 | Yamamoto et al. | ............. | 370/242 |
| 6,349,101 B1 * | 2/2002 | Yamashita | ............. | 370/412 |
| 6,539,532 B1 * | 3/2003 | Levi et al. | ............. | 716/117 |
| 6,618,455 B1 * | 9/2003 | Maeda et al. | ............. | 375/354 |
| 6,717,953 B1 * | 4/2004 | Heuer et al. | ............. | 370/466 |
| 6,785,297 B2 * | 8/2004 | Matsumoto | ............. | 370/474 |
| 6,965,612 B2 * | 11/2005 | Chohan et al. | ............. | 370/465 |
| 6,999,480 B2 * | 2/2006 | Subrahmanyan et al. | ............. | 370/516 |
| 7,009,978 B2 * | 3/2006 | Kofoed et al. | ............. | 370/395.3 |
| 7,050,391 B1 * | 5/2006 | Mao | ............. | 370/218 |
| 7,050,463 B1 * | 5/2006 | Cho et al. | ............. | 370/476 |
| 7,106,968 B2 * | 9/2006 | Lahav et al. | ............. | 398/47 |
| 7,143,199 B1 * | 11/2006 | Ambrose | ............. | 710/8 |
| 7,353,288 B1 * | 4/2008 | Rangavajjhala et al. | ............. | 709/236 |
| 7,379,481 B2 * | 5/2008 | Lipski et al. | ............. | 370/535 |
| 7,385,998 B2 * | 6/2008 | Wang | ............. | 370/420 |
| 7,480,786 B1 * | 1/2009 | Crabill | ............. | 712/34 |
| 7,552,405 B1 * | 6/2009 | James-Roxby | ............. | 716/103 |
| 7,586,941 B2 * | 9/2009 | Gonda | ............. | 370/466 |
| 7,599,372 B2 * | 10/2009 | Kwak et al. | ............. | 370/395.1 |

(Continued)

OTHER PUBLICATIONS

CORE Technologies, Soft CPU Cores for FPGA, no date.*

(Continued)

*Primary Examiner* — Backhean Tiv
(74) *Attorney, Agent, or Firm* — John J. King

(57) ABSTRACT

According to various embodiments of the present invention, an intelligent framer/mapper integrates the framer, mapper, and the controlling function of the host processor, implemented as either a soft processor or an embedded processor, into a single device, such as a programmable logic device. The use of the soft processor or embedded processors on the device reduces the load on the host processor on the line card. According to some aspects of the invention, the devices takes advantage of an embedded, dedicated processor and/or soft processor(s) to allow for a distributed processing on a single chip.

17 Claims, 5 Drawing Sheets

U.S. PATENT DOCUMENTS

| | | | | |
|---|---|---|---|---|
| 8,006,204 B2* | 8/2011 | Killian et al. | | 716/100 |
| 2002/0191640 A1* | 12/2002 | Haymes et al. | | 370/466 |
| 2003/0056017 A1* | 3/2003 | Gonda | | 709/251 |
| 2003/0081710 A1* | 5/2003 | Takeuchi et al. | | 375/368 |
| 2003/0093703 A1* | 5/2003 | Oliver et al. | | 713/400 |
| 2005/0141568 A1* | 6/2005 | Kwak et al. | | 370/539 |
| 2005/0265251 A1* | 12/2005 | Acharya et al. | | 370/252 |
| 2006/0018260 A1* | 1/2006 | Richmond et al. | | 370/236.2 |

OTHER PUBLICATIONS

Wikipedia, Soft Microprocessor, p. 1.*

Wikipedia, Microprocessor, pp. 1-13.*

Wikipedia, Integrated Circuit, pp. 1-12.*

Wikipedia, Field-programmable Gate Array, pp. 1-11.*

Wikipedia, Embedded System, pp. 1-10.*

Virtex-II Platform FPGA User Guide, UG002 (v1.8) Apr. 16, 2004, 490 pages, Xilinx, Inc. 2100 Logic Drive, San Jose, CA 95124.

Xilinx, Inc.; Virtex II Pro Platform FPGA User Guide, (v2.6); Apr. 19, 2004; available from Xilinx, Inc.; 2100 Logic Drive, San Jose, California 95124; pp. 1-541.

* cited by examiner

INTEGRATED CIRCUIT AND METHOD OF EMPLOYING A PROCESSOR IN AN INTEGRATED CIRCUIT

FIELD OF THE INVENTION

The present invention relates generally to programmable logic devices, and in particular, to a method of employing a processor in a programmable logic device.

BACKGROUND OF THE INVENTION

As data rates exceed 1 Gbps, new challenges arise for backplane system designers. Signal integrity is critical for data throughput levels in excess of 40 Gbps. Network processors (NPUs) provide a low-cost means of accelerating packet processing in communications equipment. However, today's NPUs are inflexible and lack the performance required for high-speed traffic. System interface standards address increasing bandwidth requirements between IC components, line cards, and systems. Developing systems interfaces consumes a considerable amount of time and engineering resources. Multiple interface support is often required as ASICs, ASSPs, memory, and microprocessors support different system interfaces that may involve older protocols. Switched architectures based on serial signaling technologies are required to address multi-gigabit backplanes.

In any conventional line card with a telecommunications system such as an add/drop multiplexer (ADM) or multi-service provisioning platform (MSPP), a framer and a mapper are provided separate from a host processor which controls their functionality. For example, the host processor may communicate with a shelf controller, while the shelf controller may communicate with a system controller. Alternatively, the host processor may communicate with a system controller if the system is small and a shelf controller is not required. As can be seen in FIG. 1, a block diagram of a conventional system for generating and outputting frames of data from a line card in a data communication network is shown. In particular, a conventional communication system 100 comprises a line card 102, coupled to a backplane 104, which communicates with a shelf/system controller 106 and/or a system controller 108. The line card comprises a framer 110, a mapper 112, and a switch/node point (NP) 114, each of which is coupled to a host processor 116. The system 100 could be, for example, a generic Packet over SONET(POS)/SDH line card typically found in a multi-service provisioning platform.

As can be seen in FIG. 1, the host processor is a separate component from the framer, mapper and switch. Therefore, while the card itself has intelligence (i.e. the host processor), the framer, mapper and switch do not. The framer, mapper and switch are dependent on the host processor for control. Because the controlling function is external to the framer, mapper and switch components, only read/write register access is possible. Configuration, monitoring, alarm handling, protection switching and performance monitoring functions, for example, are therefore controlled via this register access, and the host processor is continuously polling or responding to interrupts from framer, mapper and switch components. All accesses span function calls on the host processor running different applications. While some of the applications are repetitive, others require very tight loops to maintain state information. Operating systems typically run in hundreds of milliseconds based on a task based scheduler. However, transmission functions of the framer/mapper change in the microsecond range (i.e. a standard frame is 125 microseconds). Therefore, there is often a mismatch in the needs of the operating system run by the host processor, forcing the operating system scheduler to run faster to attempt to capture the changes occurring in the framer.

Further, providing framers, mappers and switches separate from the host processor requires more space and unnecessarily consumes board area. For example, the separate devices require large processor buses, and often require external buses which can be used for such things as digital control channels (DCC), break out of overhead for external access, High-Level Data Link Control (HDLC) controllers for packet over SONET applications, Utopia buses, debug ports, different backplane buses, separate cross links for protection switching, etc. Also, there is an increase in the potential for non-compliance to electromagnetic compatibility (EMC) with the additional buses. Finally, additional devices and interconnections increase the ambient or background noise of a card, possibly creating interference levels above acceptable thresholds.

Accordingly, there is a need for an improved programmable logic device and method of employing a processor in a programmable logic device.

SUMMARY OF THE INVENTION

According to various embodiments of the present invention, an intelligent framer/mapper integrates a framer, mapper, and the controlling function of the host processor, implemented as either a soft processor or an embedded processor, into a single device, such as a programmable logic device. The use of the soft processor or embedded processors on device reduces the load on the host processor on the line card. According to some aspects of the invention, the device takes advantage of an embedded dedicated processor and/or soft processor(s) to allow for a distributed processing on a single chip.

A method of employing a processor in a programmable logic device implemented on a line card of a data communication network is also described. The method comprises steps of providing a framer in the programmable logic device; providing a processor on the programmable logic device; controlling the framer with the processor; and generating output data from the line card based upon the step of controlling the framer with the processor.

Programmable logic devices according to embodiments of the present invention are also disclosed. According to one aspect of the invention, a programmable logic device comprises a framer implemented in the programmable logic to transfer data according to a predetermined protocol; a processor on the programmable logic device and coupled to control the framer; and an output coupled to the framer, the output providing the data from the framer to a device external to the programmable logic device.

DETAILED DESCRIPTION OF THE DRAWINGS

Figure 2:
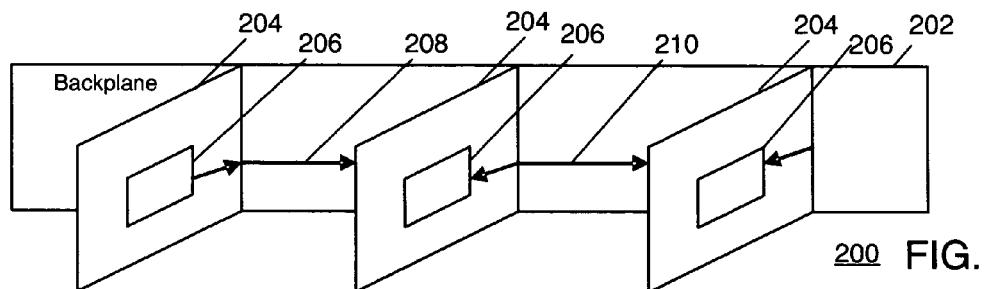
FIG. 2 is a block diagram of a data communication network according to an embodiment of the present invention.

Turning first to FIG. 2, a block diagram of a data communication network according to an embodiment of the present invention is shown. In particular, a backplane 202 is adapted to receive a plurality of printed circuit boards (PCBs) 204. The printed circuit boards preferably comprise a plurality of integrated circuits 206, including programmable logic devices (such as a field programmable gate array (FPGA) or a complex programmable logic device (CPLD)) or an application specific integrated circuit (ASIC). The integrated circuits on the printed circuit board could be coupled to the backplane and/or other printed circuit boards coupled to the backplane by way of transmission media, such as a transmission media 208. As will be described in more detail in reference to the remaining figures, data can be transmitted between integrated circuit 206 and the backplane and/or another integrated circuit on a separate printed circuit board. Although a single backplane is shown, the present invention could also apply to a plurality of backplanes 202 coupled to one another on a rack, or coupled to one another on separate racks.

Figure 3:
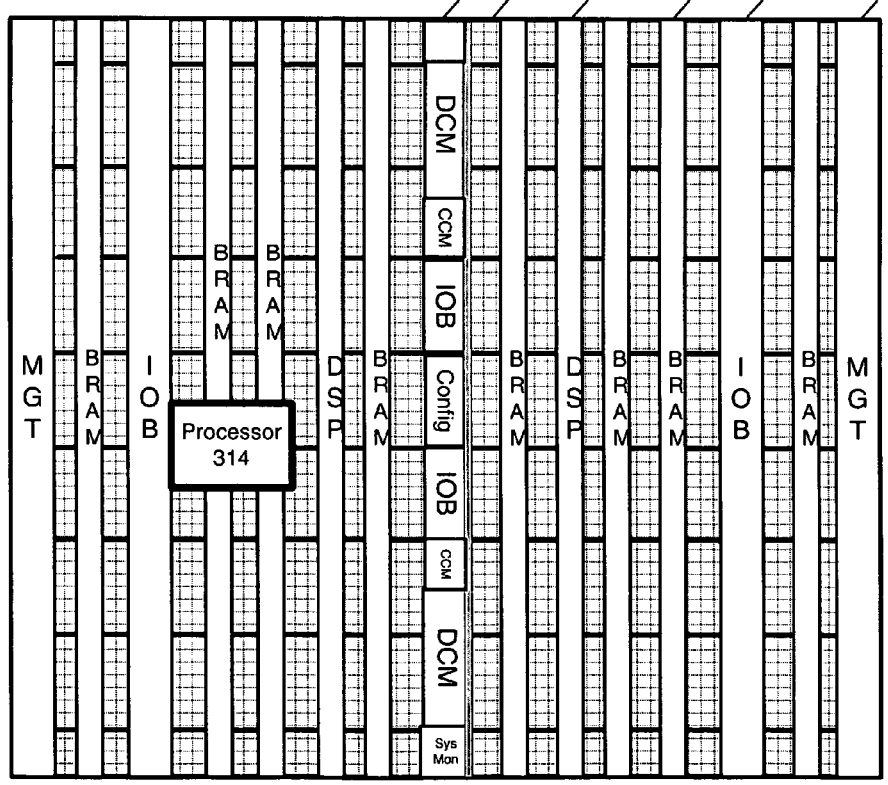
FIG. 3 is a block diagram of a programmable logic device employed in the system of FIG. 2 according to an embodiment of the present invention.

Turning now to FIG. 3, a block diagram of a programmable logic device employed in the system of FIG. 2 according to the present invention is shown. In particular, the circuitry of the FPGA 300 is laid out across the surface of a die as a plurality of columns of repeatable tiles. Although the majority of columns have substantially homogeneous circuits, a heterogeneous center column 302 has a variety of different circuits. For example, the circuit elements in column 302 may include a system performance monitor (SYSMON) circuit, a digital clock manager (DCM) circuit, a clock companion module (CCM) circuit, and configuration logic (CONFIG). The system performance monitor may include an analog-to-digital converter (ADC) to monitor parameters such as temperature and voltage both on-chip and off-chip. The DCM may include circuits to perform clock de-skew, clock phase shifting, clock frequency synthesis, and other clock features. The CCM may include circuits for phase-matched binary clock division and internal clock jitter & skew measurement. The configuration logic includes logic needed to address and load the configuration memory cells of the SRAM-based FPGA during configuration of the FPGA. The configuration logic in this example also may include configuration registers, boundary scan test circuitry such as JTAG circuitry, and encryption and/or decryption circuitry used to encrypt and/or decrypt bitstreams of configuration data loaded into and read out of the FPGA.

Each homogeneous column preferably has substantially identical circuit elements substantially filling the column. The substantially identical circuit elements in a column are of a particular circuit type from a group of circuit types that may include a Configurable Logic Block (CLB) type 304, a Block Random Access Memory (BRAM) type 306, a Digital Signal Processor (DSP) type 308, an Input/Output Block (IOB) type 310, and a Multi-Giga Bit Transceiver (MGT) type 312. The configurable logic blocks are preferably used to implement the various circuits described in FIGS. 4-6. Similarly, the BRAM is preferably used to store the configuration data for configuring the programmable logic device as will be described in more detail below. Finally, the FPGA 300 may comprise an embedded processor 314.

Another example of a FPGA having an embedded processor employed in the system of FIG. 2 is the Virtex-II Pro™ FPGA from Xilinx Corp. of San Jose Calif. (see the Virtex-II Pro™ Platform FPGA User Guide UG012 (v2.6) 19 Apr., 2004, from Xilinx, Inc., which is herein incorporated by reference). Yet another example having one or more softcore processors is the Virtex-II FPGA from Xilinx, Inc. (see Virtex-II Platform FPGA User Guide UG002 (v1.8) 16 Apr. 2004 from Xilinx, Inc., which is herein incorporated by reference).

Figure 4:
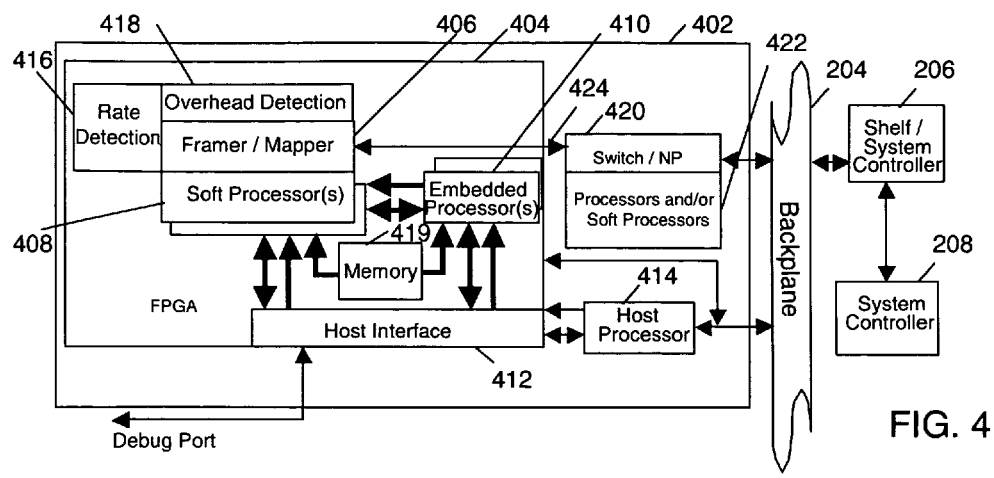
FIG. 4 is a block diagram of a system for generating and outputting frames of data according to an embodiment of the present invention.

Turning now to FIG. 4, a block diagram of a system for generating and outputting frames of data according to an embodiment of the present invention is shown. In particular, a line card 402 comprises a programmable logic device 404, such as a field programmable gate array. The programmable logic device could be, for example, a Virtex II Pro™ field programmable gate array available from Xilinx, Inc. of San Jose, Calif. The programmable logic device comprises a framer/mapper block 406 and one or more soft processors 408. The soft processors could be, for example, Micro-Blaze™ or PicoBlaze™ soft processors, also available from Xilinx, Inc. Depending upon the complexity of the application, the programmable logic device could also comprise one or more embedded processors 410. The embedded processor, also known as a hard processor, could be a PowerPC™ processor, available from IBM Corporation, White Plains, N.Y., or some other suitable processor. A host processor interface 412 enables communication between the soft processor(s) and/or embedded processor(s) of the programmable logic device and an optional host processor 414. The programmable logic device 404 also comprises a rate detection block 416 and an overhead detection block 418, the functions of which will be described in more detail below. A memory 419 is coupled to the processors to store configuration information related to desired framers to be implemented in the programmable logic device. Finally, a switch/node point 420 and other processors or soft processors 422 of the line card coupled to the programmable logic device 402 by way of an output 424 can communicate with the backplane 204.

Figure 1:
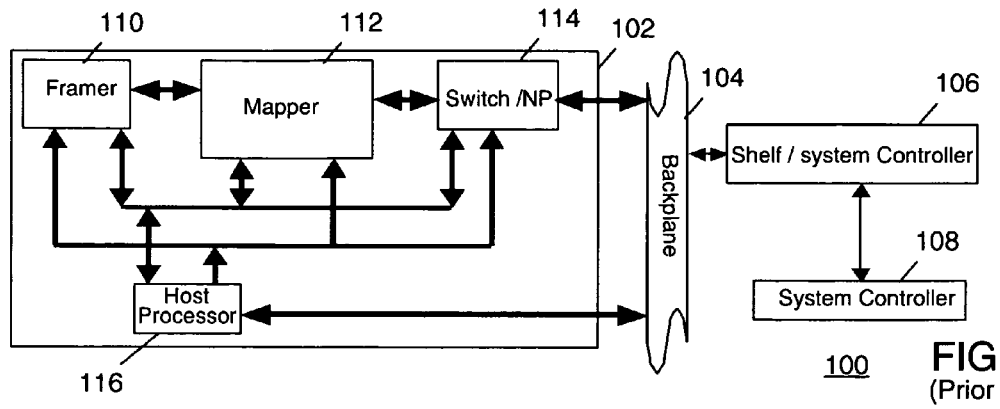
FIG. 1 is a block diagram of a conventional system for generating and outputting frames of data from a line card in a data communication network.

According to one aspect of the embodiment of FIG. 4, the use of multiple soft processors and an embedded processor makes the line card more efficient and more cost effective. Although the host processor 414 is shown outside the programmable logic device 404, such a host processor is not required, but may be used to accommodate existing systems or designers who prefer using a host processor. As can be seen in the embodiment of FIG. 4, the number of devices on the line card has been reduced compared to a conventional system, such as that shown in FIG. 1, leading to a reduction in the overall power and decoupling of the card. The number of connections has also been reduced, thereby reducing both conducted and radiated interference. Finally, reduced input and output from other parts of the card will help in the overall noise of the card and reduce susceptibility to interference.

By providing the control functions of the framer/mapper 406 in a processor on the programmable logic device, the embodiment of FIG. 4 reduces the number and need for address and data buffers, since the majority of the processor bus is internal to the programmable logic device 404, and therefore the need for external buffers is reduced. The available area on the line card is also increased. Because board space is a scarce resource in the case of gateway line cards where digital signal processors (DSPs) use the majority of space, such an increase in board space provide a significant advantage over conventional systems. Reducing the need for buffers and buses maximizes the space for other functions. Finally, the simplification of the framer function by providing soft and/or embedded processors allows the framer to be moved to an interface module, where optic and line interface units (LIU) tend to reside. As will be described in more detail in reference to the remaining figures, the embodiments of FIGS. 5 and 6 enable the processing of signaling bits (e.g. ABCD state changes), alarms, trunk conditioning, etc. Depending on the function, an appropriate soft processor may be used in a distributed architecture, which would depend on whether the framer is E1/DS1 or E3/DS3 or multiplexer (such as M13 mux). Depending on the existence of a card host processor and multiple instantiations of the framer/mapper, the embedded processor can provide the overall controlling function of the framer and mapper.

Figure 5:
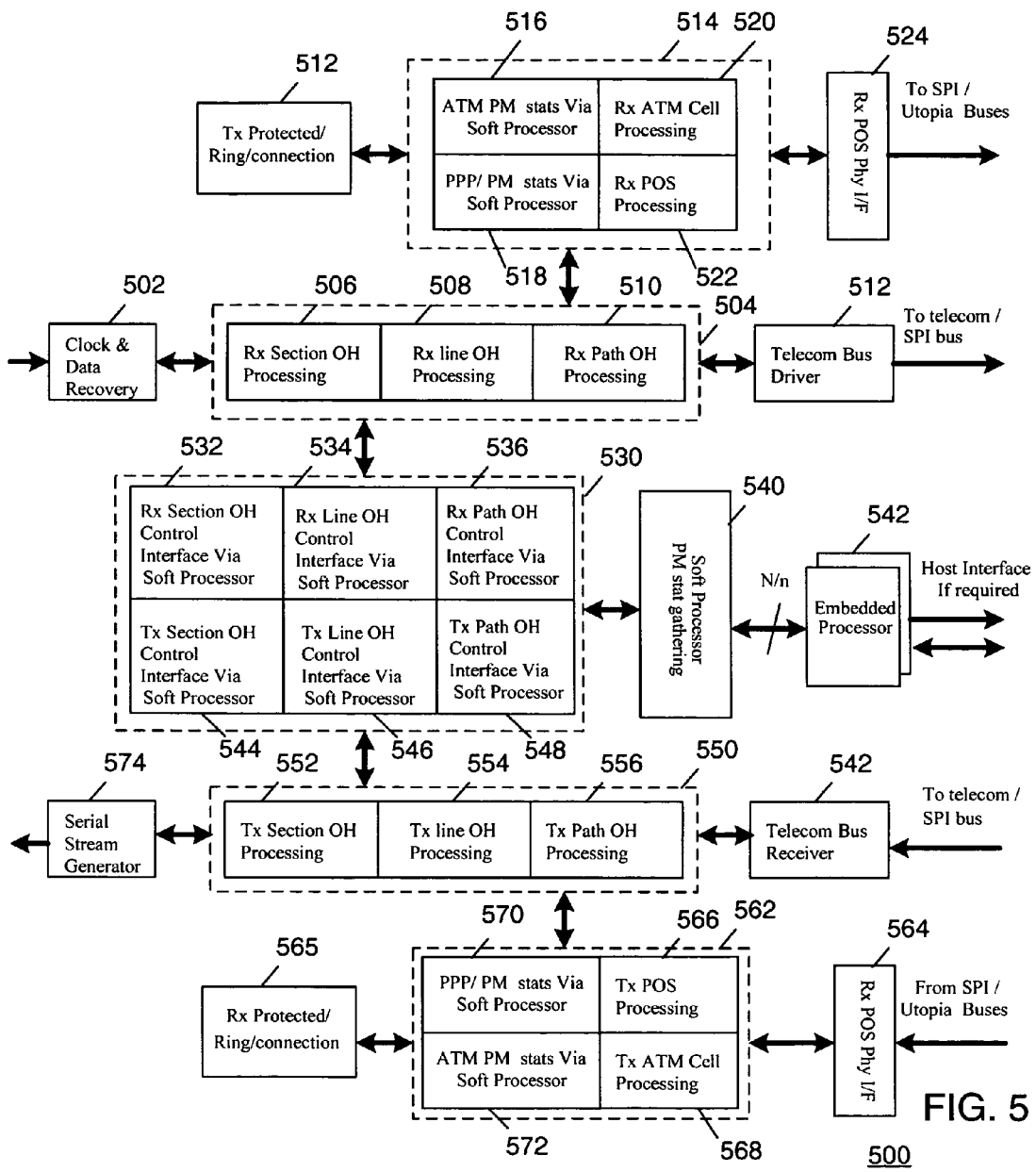
FIG. 5 is a block diagram of a circuit for generating and receiving SDH data according to an embodiment of the present invention.

Turning now to FIG. 5, a block diagram of a circuit for generating and receiving Synchronous Digital Hierarchy (SDH) data according to an embodiment of the present invention is shown. The circuit of FIG. 5 is preferably implemented on the programmable logic device of FIG. 4, and except for the embedded processor, in a configurable logic block of FIG. 3. A clock and data recovery circuit 502 is coupled to a receiver processing block 504 comprising a receiver section overhead processing block 506, a receiver line overhead processing block 508, a receiver path overhead processing block 510, which are well known in the art. The receiver path overhead processing block 510 is coupled to a telecommunications bus driver 512, which provides generally provides data such as voice data to a telecommunications or SPI bus.

A transmit protected/ring connection block 512, which controls the path of the transmission of data, is coupled to a receiver performance monitor/processor block 514. The receiver performance monitor/processor block 514 comprises an ATM performance monitor (PM) block 516 which provides performance monitor statistics via a soft processor, such as the soft processor 408 of FIG. 4. The receiver performance monitor/processor block 514 also comprises a point-to-point processing (PPP) performance monitor 518 which also provides performance monitor statistics via a soft processor. The receiver performance monitor/processor block 514 also provides a processing function, including a receiver ATM cell processing function 520 and a receiver packet over sonnet (POS) processing function 522. Finally, data from the receiver processing block 504, after processing by the receiver performance monitor/processor block 514, is coupled to the receiver POS physical interface 524, which provides data to an SPI or Utopia bus, for example. The SPI and Utopia buses provide data channels, and generally carry unbundled data frames which have just been received. The operation of the receiver processing block 504 and the receiver performance monitor/processing block 514 in the processing of SDH data as is well known in the art.

A soft processor interface 530 is also coupled to the receiver processing block 504 and comprises a receiver section overhead control interface block 532, a receiver line overhead control interface block 534, and a receiver path overhead control interface block 536. These control interfaces provide performance monitoring data to a soft processor performance module 540. The soft processor performance module 540 generally gathers statistics related to the operation of the clock and data recovery clock circuit 502, and is coupled to an embedded processor 542, if one is used, to aggregate any statistics related to the receiving of data. The embedded processor could provide data to a host interface if a host processor is used. The soft processor interface 530 also comprises a transmitter section overhead control interface block 544, a transmitter line overhead control interface block 546, and a transmitter path overhead control interface block 548. These control interfaces also provide transmission performance monitoring data, related to the transmission of data, to the soft processor performance module 540.

The transmitter portion of the circuit 500 also comprises a telecommunication bus receiver 542 which receives data from a telecommunication bus. The telecommunication bus receiver 542 is coupled to a transmitter processing block 550 comprising a transmitter section overhead processing block 552, a transmitter line overhead processing block 554, and a transmitter path overhead processing block 556, which are also well known in the art. The transmitter processing block 550 is coupled to a transmitter performance monitor/processor block 562 which receives data from a SPI bus or Utopia bus by way of a receiver POS physical layer interface 564 and control information for the receiver protected and ring connection circuit 656. The transmitter performance monitor/processor block 562 also provides a processing function, including a transmitter packet over sonnet (POS) processing function 566 and a transmitter ATM cell processing function 568. The transmitter performance monitor/processor block 562 also comprises a point-to-point processing performance monitor 570 which provides performance monitor statistics via a soft processor. Finally, the transmitter performance monitor/processor block 562 comprises an ATM Performance Monitor block 572 which provides performance monitor statistics via a soft processor. Data from the telecom bus via the telecom bus receiver 542, or the SPI/Utopia buses via the receiver POS physical layer interface 564 after processing by the transmitter processing block 550, is coupled a serial stream generator 574. Accordingly, the embodiment of FIG. 5 provides a framer which is either channelized or concatenated with the use of a processor, such as a soft processor or an embedded processor in the programmable logic device on the line card, in processing the overhead bytes, alarms and protective switching, as will be described in more detail in reference to the flow charts of FIGS. 8 and 9.

Figure 6:
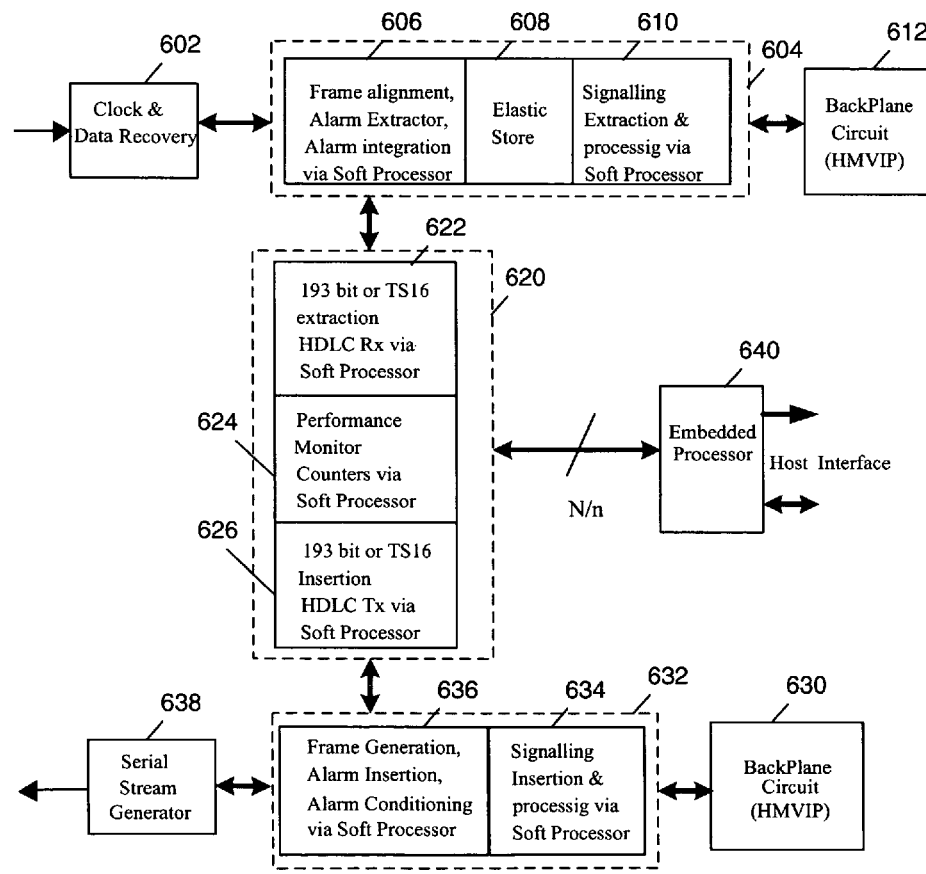
FIG. 6 is block diagram of a circuit for generating and receiving PDH data according to an embodiment of the present invention.

Turning now to FIG. 6, block diagram of a circuit for generating and receiving PDH data according to an embodiment of the present invention is shown. The circuit of FIG. 6 is preferably implemented on the programmable logic device of FIG. 4, and except for the embedded processor 640 and the backplane circuits 630 and 640, in a configurable logic block of FIG. 3. In particular, a clock and data recovery circuit 602 is coupled to a receiver processing block 604 comprising a frame alignment block 606, and elastic store block 608 and a signaling extraction and processing block 610. The receiver processing block 604 couples data to a backplane circuit 612. The receiver processing block 604 is also coupled to a data analyzer 620 comprising a first bit extractor 622 for extracting the 193 bit for the Plesiochronous Digital Hierarchies (PDH) standard in the United States, or TS16 bits for the PDH standard in Europe, as are well know in the art. The data analyzer 620 also comprises a performance monitor counter block 624 and a second bit extractor 626 for extracting the 193 bit or TS16 bits of data to be generated. That is, data received from the backplane circuit 630 is coupled to a transmitter processing circuit 632 comprising a signaling insertion and processing block 634 and frame generation block 636. Data is then coupled to a serial stream generator 638. The data analyzer block 620 is also coupled to an embedded processor 640 for aggregating information related to the received or transmitted data.

The embodiments of the present invention provide a number of significant improvements which affect the operation and performance of the framer. One improvement lies in the area of auto-configuration. Currently, different framers exist for different speeds and employ either SONET/SDH or PDH. Similarly, there are conventional application specific standard products (ASSPs) containing multiple framer types. However, the host processor of a line card employing the ASSP must be programmed with the information to configure the framer. Hence, the framer becomes installation and application dependent, and therefore effectively becomes a single framer with respect to the software associated with an application. However, by instantiating a framer or giving the programmable logic device access to multiple framers in memory and applying intelligence to the framer by controlling the framer on a programmable logic device with a processor also on the device, it is possible to install a new framer at any time according to the present invention.

It is also possible to determine the required new framer by auto rate detection and auto protocol detection. For example, SONET and SDH both have the same rates from 155 Mb/s and greater. However, both the overhead and the mappings for SONET and SDH are different. By using a rate detector between the physical layer and the framer, it is possible to determine if the framer is connected to OC3/STM1 (155 Mbps), OC12/STM4 (622 Mbps), OC48/STM16 (2.5 Gbps) or OC192/STM64 (10 Gbps). After determining the rate, it is then possible to determine if the data is SONET or SDH. This can be achieved by examining the overhead bytes and taking advantage of the differences in overhead bytes, such as A1, A2, C1 for example.

The complete framer including the rate detector and overhead detector is then loaded. This can be done either by the soft processor or by the embedded processor. Based on the results of each load, the appropriate framer type is downloaded and the programmable logic of the programmable logic device is configured. Unlike a conventional system which requires the host processor to interact with the programmable logic device, the embodiments of the present invention enable the framer type to be implemented automatically without any intervention from the host processor, thereby allowing the host processor to perform other tasks on the card unimpaired. The use of rate sensing and a soft processor enable the interface type to be determined by providing information on the data rates or exact protocols being transmitted from the physical layer. The framer receives data from a physical layer transceiver. A multi-rate physical layer transceiver could be used where SONET/SDH 155 Mb/s is either OC3 or STM1 for example, and other values for the higher rates. By examining the section overhead bytes with a soft processor, such frame bytes as A1, A2 and the C1 bytes, it is possible to distinguish between SONET and SDH structures. Hence, the embedded processor can configure the framer(s) to suit the interface by downloading the appropriate code from memory, providing significant advantage over conventional systems. In a similar way, the mapper function can be channelized, or POS/ATM can be determined for path overhead allowing either level 1/3 mappers or cell delineation or point to point processing to be loaded. Rate determination in the case of a PDH device is slightly different because the rate is enough to determine the appropriate framer. For example, a rate of 1.544 Mb/s is DS1, a rate of 2.048 Mb/s is E1, a rate of 8192 is E2, a rate of 34 Mb/s is E3, a rate of 45 Mb/s is DS3, etc. Therefore, the intelligence of the framer allows the framer type to be loaded based upon the rate determination alone in the case of a PDH structure.

Another improved function of the embodiments of the present invention is that of alarm handling. Alarm handling requires significant processing time of the host processor in a conventional system because it must either react to interrupts and/or interrogate registers. This is quite time consuming on the host processor operating system. For example, the host processor must respond to interrupts if the framer is set up or poll the registers if the framer is not set up. Further, there is a significant difference between the repetition rate of a framer, which changes in the order of microseconds, and the operating system on the host processor running in the order of milliseconds. In alarm handling, the host processor must detect the error (i.e. by either poll or interrupt from the framer), then perform a persistence check of the alarm to ensure it is a genuine alarm condition on the card and take action.

The command structure of a soft processor allows for command customization, which in turn will allow for more efficient functional partitioning. Because alarm handling lends itself to single command functions (e.g. detect persist and react) which are adapted for the specific framer, alarm handling is well suited for a soft processor or embedded processor on the programmable logic device as shown in the embodiment of FIG. 4, rather than a general-purpose host processor. Considering a specific case of a "loss of frame" alarm, it covers both SONET/SDH and PDH framers. If the frame sync is lost, several frames periods will pass before declaring that frame sync has been lost. The local alarm must be raised on the card (e.g. an LED on front panel or system management). Because the processor must also react to the alarm in this case by returning AIS, the reaction is alarm dependent and well defined.

According to the embodiment of FIG. 4, the soft processor 408, which is part of the framer, could perform the alarm detection, minimizing the effect on the operating system. The soft processor will maintain the alarm, and after it is determined that the alarm exists, react by returning the appropriate line condition. The soft processor will also inform the host processor of the alarm, thereby allowing it to raise the alarm condition. Because alarms are rarely singular and require the processor involved to be monitoring all alarm sources on a regular basis, such a requirement to monitor the alarms tends to provide an unnecessarily load on the host processor. However, if there are multiple framers, the embedded processor maybe used to gather the alarms and the report the alarms to the host processor so it can perform the appropriate functions such as light an led, inform the shelf controller, take the card out of service, etc.

Another improved function of the embodiments of the present invention is that of performance monitoring. Because it is important to maintain counters of errors that occur and generate reports on items such as error seconds, etc., a processor must be designated to perform the function of performance monitoring. If the host processor of a conventional system is designated, it will be interrupted or will poll the framer when an error occurs. In a large system, the system controller polls the shelf controller, which in turn polls the card host processor for updates. But in a small system, it is the host processor itself that acts as the network element and talks directly to the network manager. However, the performance monitoring functions of the embodiments of the present invention can be spread across multiple processors depending on the size of the system. Accordingly, the process of gathering the statistics is typically provided where the errors occur in the framer. The type of errors of interest depends on the framer. Some typical errors include loss of signal, loss of frame, BIT errors (SONET/SDH), BPV (PDH Framers), and line errors such as AIS, RDI, etc. Other overhead bytes may also be considered to detect errors depending on the MIB slips, pointer movement, and synchronization, for example.

These errors also require persistence timers to be run to ensure they are real errors rather then momentary glitches. Based on these errors, a set of counters must be kept to get the accumulated effect. A set of statistics is preferably generated at regular intervals. According to an embodiment of the present invention, the embedded processor (or a soft processor, depending on the number of framer/mapper instantiations) would gather the information, maintain the counters, and generate the statistics of errors. The embedded or soft processor would then inform the host processor of the statistics, allowing the host processor to present its results to the system controller and then to the network manager. Therefore, the only requirement of the host processor in this function is to periodically receive the end results, leaving it free to perform other tasks. If there is only one framer rather than multiple framers in the same FPGA, then the soft processor would preferably perform all the tasks related to performance monitoring.

Another improved function of the embodiments of the present invention is that of monitoring DCC channels. In conventional systems, the framer will present the DCC channels as two serial clock and data interfaces (i.e. line and section DCC channels), which either requires the host processor or a dedicated module to run the appropriate protocol. According to the embodiments of the present invention, the embedded processor can run the appropriate protocol for the DCC channel, and the host processor will not need to be involved. Accordingly, the embodiments of the present invention lead to noise improvements because the signals do not leave the programmable logic device which reduces both conducted and radiated interference.

The embodiments of the present invention also enable access to other overhead bytes. For example, over wire in SONET can be handled by a soft processor with minimal or no intervention from the host processor. Overhead handling differs depending upon whether a SONET/SDH or PDH protocol is used. In SONET/SDH, overhead handling could be, for example, line and section DCC channels D bytes of the overhead; synchronization M byte of the overhead; over wire, etc. In PDH, overhead handling could be, for example, National bits used to control remote multiplexers, International bits, signaling bits "ABCD", signaling protocols such as V5.2, G.303, Serial data link, etc.

Conventional framers make DCC channels available as a serial clock and data interface, and the host processor or another module must process the management channels.

According to the present invention, the embedded processor can service these channels directly without any or with minimal intervention from the host processor. Considering DCC channels comprising an OC48 system made up of 16 OC3, 32 DCC channels are used in a conventional system. The embedded processors of the embodiments of the present invention can be dedicated to this task, thereby reducing the complexity of the system and the burden on the host processor. The embedded processor can handle these functions for the other SONET/SDH overhead handling independently of the host processor. Similarly, in the case of PDH, accessing the national/international bit in most framers is via access to a 64 kbit channel interpreting their meaning and performing the appropriate task, the majority of which can be handled by a dedicated soft processor within the framer according to embodiments of the present invention. Signaling and state detection, the basis of local exchanges, today is quite an overhead for a local host processor maintaining 24/30 channels of state per span, running signaling state machines and line conditioning. This task is a straightforward task for a soft processor dedicated to the framer, where only the final result such as on/off hook or dialing and digits need to be provided to the host processor.

Unlike conventional systems where signaling protocols require high-level data link control (HDLC) controllers and protocol software to be run, the embodiments of the present invention enable signaling protocols to be easily performed by a dedicated soft processor associated with that framer, rather then a host processor having to run multiple sessions across multiple framers. Finally, data link handling is a task easily handled by a dedicated soft processor where all it needs to contend with is responding to the link requests. The host processor maybe informed of the request if it is outside the framers domain. Although the tasks set forth above individually are relatively simple, all of the tasks together can become unmanageable for a host processor considering that there may be a large number of framers.

Another improved function of the embodiments of the present invention can be found in protective switching. Currently, protective switching is a processor intensive task because of the tight loop keeping both the active and protection cards in synch along with monitoring the K1/K2 bytes and communicating between the active and protected module. According to the embodiments of the present invention, these functions would be done by internal communication between the soft and embedded processors, breaking up the fault and alarm detect K1/K2 byte function controlling the cross link switch and communicating with the other framer on the other module. According to the embodiments of the present invention, the communication between modules can use the serial protection connection to overlay the communication between cards, and therefore no separate communication mechanism is necessary, thereby reducing the requirement on the host processor.

Another improved function of the embodiments of the present invention can be found in the use of transparent software. If there is a requirement to change the framer for increased bandwidth or upgraded functionality in a conventional system, the software drivers must be changed. For example, there may be more registers to access or the registers content may differ. According to the embodiments of the present invention, the soft processor (if only one framer is used) or a combination of soft processors and an embedded processor (if multiple framers are used) can first bring up the framer as a default after reset. The host processor would then address the framer as if it were the original framer and translate the address and command into a form recognizable by the new framer. Therefore, the host processor software is unaffected. This also applies to all functions of the framer. The outcome is a simplified transition between framer types. This also would apply to Ethernet MACS, telecom mappers and TSI (time space interchange) switches or any ASSP replacement by an FPGA equivalent processor enriched function.

In the case of PDH, the rate is enough to determine the interface (i.e. 1.544 Mb/s is DS1 while 2.048 Mb/s is E1, and so on for E2, E3, DS3). Hence, the hard processor/soft processor can configure the framer(s) to suit the interface by downloading the appropriate code from memory. Unlike conventional systems, the signaling bits and protocols such as V5.2 and G.303 according to the embodiments of the present invention can be run on the hard processor and signal state changes on the soft processor, resulting in fast reaction time due to dedicated processor to the function. In the case of systems controlled by decadic and higher signaling systems such as SS7 R1/R2, state changes (hook flash, seize acknowledge, etc.) must be monitored and responded to. This monitoring can be run on a combination of a soft processor and a hard processor.

Figure 7:
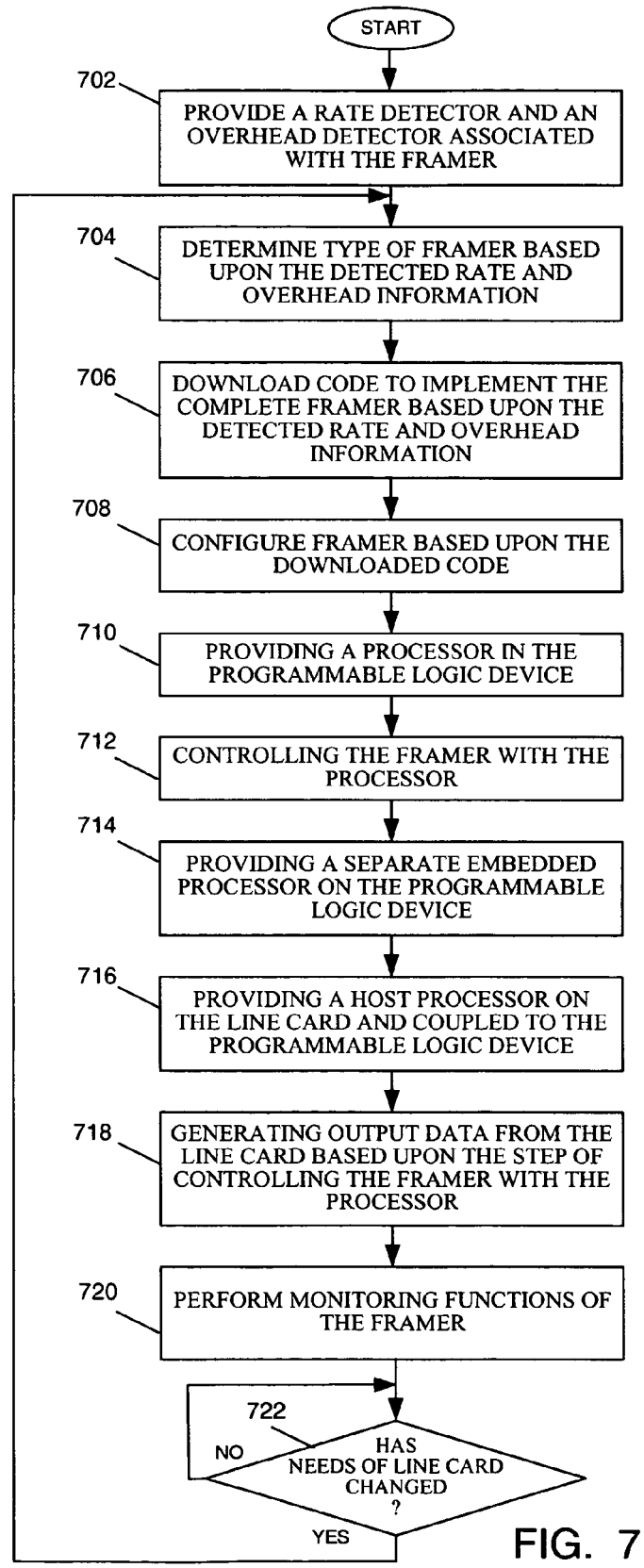
FIG. 7 is a flow chart showing a method of employing a processor in a programmable logic device according to an embodiment of the present invention.

Turning now to FIG. 7, a flow chart shows a method of employing a processor in a programmable logic device according to an embodiment of the present invention. In particular, a framer having a rate detector and an overhead detector is provided in the programmable logic device at a step 702. A type of framer is then determined based upon the detected rate and overhead information at a step 704. The rate and overhead information could be detected by rate detection circuit 416 and overhead detection circuit 418, for example. Code to implement the complete framer for the interface type is then downloaded from a memory, such as memory 419, at a step 706. The framer is then configured with the downloaded code based upon detected rate and overhead information at a step 708. A processor is preferably provided on the programmable logic device at a step 710. The processor could be soft processor 408 or embedded processor 410, as described above in reference to FIG. 4. The framer is then controlled with the processor at a step 712. A separate embedded processor, such as embedded processor 410, is also optionally provided on the programmable logic device at a step 714. A host processor is provided on the line card and coupled to the programmable logic device at a step 716. Output data is then generated from the line card based upon the step of controlling the framer with the processor at a step 718. The performance of the data transmission is monitored at a step 720, as will be described in more detail in reference to FIG. 9. It is then determined if the needs of the line card or other device employing the method of the present invention have changed at a step 722. If not, the processor continues to monitor the performance of the circuit. Alternatively, the device will determine the type of framer needed to be configured in the programmable logic device by determining a type of framer. Accordingly, the method of FIG. 7, as well as the methods of FIGS. 8 and 9 set forth below, can be performed using the circuit of FIG. 4, or some other suitable circuit.

Figure 8:
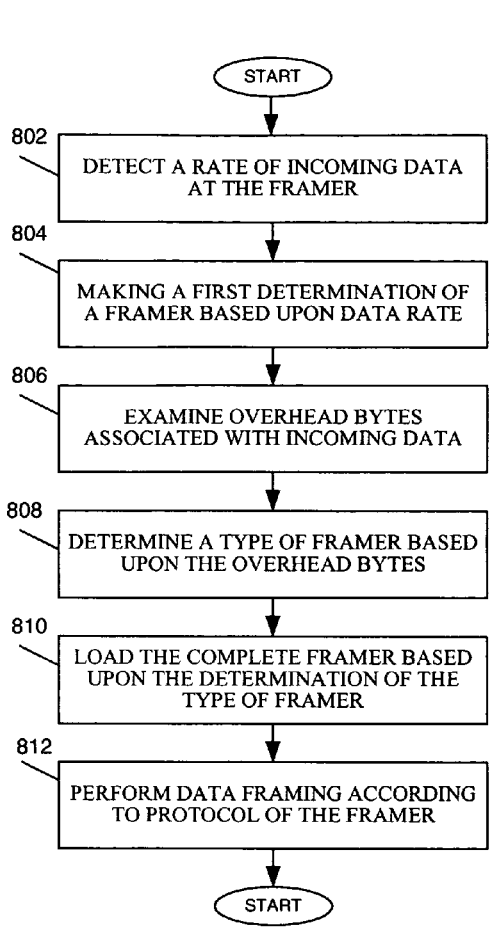
FIG. 8 is a flow chart showing a method of configuring a programmable logic device with a framer according to an embodiment of the present invention.

Turning now to FIG. 8, a flow chart shows a method of configuring a programmable logic device according to an embodiment of the present invention. A rate of incoming data is detected at the framer at a step 802. A first determination of a framer type is made at a step 804 based upon data rate detected at the step 802. Overhead bytes associated with incoming data are examined at a step 806. A type of framer is then determined at a step 808 based upon the overhead bytes. The complete framer is then loaded, based upon the determination of the type of framer, at a step 810. Finally, data framing is then performed according to protocol of the framer at a step 812.

Figure 9:
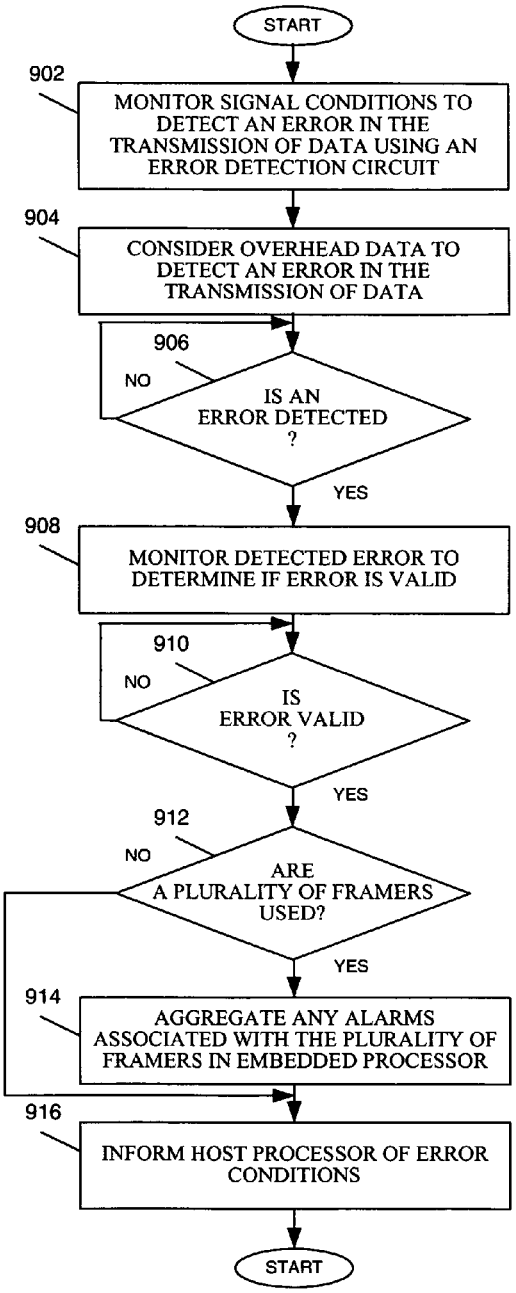
FIG. 9 is a flow chart showing a method of detecting an alarm condition according to an embodiment of the present invention.

Turning now to FIG. 9, a flow chart shows a method of detecting an alarm condition according to an embodiment of the present invention. In particular, signal conditions are monitored to detect an error in the transmission of data using an error detection circuit at a step 902. Overhead data is then monitored to detect an error in the transmission of data at a step 904. It is then determined if an error is detected at a step 906. The detected errors are monitored to determine if error is valid at a step 908. It is then determined if the error is valid at a step 910. It is then determined if a plurality of framers used at a step 912. If so, any alarms associated with the plurality of framers are preferably aggregated in embedded processor at a step 914. Finally, a host processor, if present, is informed of any error conditions at a step 916.

The embodiments of the present invention disclose the implementation of framing, mapping, distributed processing and other telecom specific tasks in a programmable logic device, such as an FPGA. With the implementation of the framer, mapper and a distributed processors and the availability of some of the features inside a FPGA, the method of performing telecom framing and mapping is greatly improved. It can therefore be appreciated that the new and novel programmable logic device and method of employing a processor in a programmable logic device has been described. It will be appreciated by those skilled in the art that, particular to the teaching herein, numerous alternatives and equivalents will be seen to exist which incorporate the disclosed invention. As a result, the invention is not to be limited by the foregoing embodiments, but only by the following claims.

The invention claimed is:

1. A method of employing a processor in an integrated circuit implemented in a data communication network, said method comprising:

loading configuration data associated with a plurality of framers including a Synchronous Digital Hierarchy (SDH) framer;

configuring said SDH framer in programmable circuits of said integrated circuit based upon said configuration data associated with said SDH framer;

configuring a plurality of soft processors in said programmable circuits of said integrated circuit, wherein each said soft processor of said plurality of soft processors is associated with a framer of said plurality of framers;

providing an embedded processor on said integrated circuit;

controlling said plurality of framers with said plurality of soft processors;

generating SDH output data based upon said controlling said plurality of framers with said plurality of soft processors;

monitoring, by each said soft processor of said plurality of soft processors, alarm conditions of an associated framer;

aggregating, by said embedded processor, said alarm conditions; and outputting said aggregated alarm conditions by way of a host interface to a host processor of a circuit board having said integrated circuit.

2. The method of claim 1 further comprising sensing a rate of transmitted data to determine a type of framer needed in the integrated circuit.

3. The method of claim 1 further comprising providing access to overhead bytes.

4. The method of claim 3 further comprising determining a type of framer based upon said overhead bytes.

5. The method of claim 4 further comprising downloading code for said type of framer from a memory.

6. The method of claim 1 further comprising detecting an alarm condition associated with a transfer of data by a framer of said plurality of framers.

7. The method of claim 6 wherein aggregating, by said embedded processor, said alarm conditions comprises aggregating alarm conditions detected by said plurality of soft processors.

8. The method of claim 7 further comprising monitoring, by said plurality of soft processors, the performance of said plurality of framers.

9. A method of employing a processor in an integrated circuit implemented in a data communication network, said method comprising:

loading configuration data associated with a plurality of framers including Synchronous Digital Hierarchy (SDH) framer;

configuring said SDH framer in programmable circuits of said integrated circuit according to said configuration data;

configuring a plurality of soft processors in said programmable circuits of said integrated circuit, wherein each said soft processor of said plurality of soft processors is associated with a framer of said plurality of framers;

providing an embedded processor on said integrated circuit;

downloading code for an SDH interface type from a memory;

controlling said plurality of framers with said plurality of soft processors;

generating SDH output data based upon said controlling said plurality of framers with said plurality of soft processors;

monitoring, by said plurality of soft processors, alarm conditions associated with said plurality of framers;

aggregating, by said embedded processor, said alarm conditions; and outputting said aggregated alarm conditions by way of a host interface to a host processor of a circuit board having said integrated circuit.

10. The method of claim 9 further comprising detecting the rate of data to be transmitted by a framer of said plurality of framers.

11. The method of claim 10 further comprising providing access to overhead bytes associated with said data.

12. The method of claim 11 further comprising determining a type of framer needed to be loaded in said integrated circuit based upon said detecting the rate of data to be transmitted and providing access to overhead bytes.

13. The method of claim 9 further comprising detecting said alarm conditions associated with a transfer of said data.

14. An integrated circuit configured to transfer data, said integrated circuit comprising:

a plurality of framers including a Synchronous Digital Hierarchy (SDH) framer implemented in programmable circuits of said integrated circuit to transfer data according to a predetermined protocol;

a configuration circuit for loading configuration data into configuration memory cells of said integrated circuit associated with said SDH framer, said configuration memory cells configuring said SDH framer to transfer data according to said predetermined protocol;

a plurality of soft processors on said integrated circuit and coupled to said plurality of framers, said plurality of soft processors controlling said plurality of framers, wherein a soft processor of said plurality of soft processors controls said SDH framer to transfer data according to said predetermined protocol;

an embedded processor further monitoring alarm conditions associated with said plurality of framers and aggregating said alarm conditions; and a host interface coupled to said plurality of framers and said embedded processor, said host interface providing said data from said plurality of framers to a device external to said integrated circuit and said aggregated alarm conditions to a host processor of a circuit board having said integrated circuit.

15. The integrated circuit of claim 14 wherein said circuit board is a line card.

16. An integrated circuit configured to transfer data, said integrated circuit comprising:

a Synchronous Digital Hierarchy (SDH) framer of a plurality of framers implemented in programmable circuits of said integrated circuit, said SDH framer configured to transfer data according to an SDH protocol;

a rate detection circuit coupled to said SDH framer;

an overhead detection circuit coupled to said SDH framer;

a configuration circuit for loading configuration data associated with said SDH framer into configuration memory cells of said integrated circuit, said configuration memory cells configuring said SDH framer to transfer data according to said SDH protocol;

a soft processor of a plurality of soft processors on said integrated circuit and coupled to said SDH framer, said soft processor implementing said SDH framer depending upon information detected by said rate detection circuit and said overhead detection circuit;

an embedded processor further monitoring alarm conditions detected by said plurality of soft processors associated with said plurality of framers and aggregating said alarm conditions; and a host interface coupled to said plurality of framers and said embedded processor, said host interface providing said data from said plurality of framers to a device external to said integrated circuit and said aggregated alarm conditions to a host processor of a circuit board having said integrated circuit.

17. The integrated circuit of claim 16 wherein said circuit board is a line card coupled to receive said integrated circuit.

* * * * *